United States Patent
Ganesan et al.

(10) Patent No.: US 9,082,465 B2
(45) Date of Patent: Jul. 14, 2015

(54) WEAK KEEPER CIRCUIT FOR MEMORY DEVICE

(71) Applicant: QUALCOMM Incorporated, San Diego, CA (US)

(72) Inventors: Balachander Ganesan, San Diego, CA (US); Ritu Chaba, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 195 days.

(21) Appl. No.: 13/765,533

(22) Filed: Feb. 12, 2013

(65) Prior Publication Data

US 2014/0226418 A1    Aug. 14, 2014

(51) Int. Cl.
G11C 7/00 (2006.01)
G11C 7/06 (2006.01)
G11C 7/12 (2006.01)
G11C 7/18 (2006.01)

(52) U.S. Cl.
CPC ......... *G11C 7/065* (2013.01); *G11C 7/12* (2013.01); *G11C 7/18* (2013.01)

(58) Field of Classification Search
CPC .......... G11C 7/22; G11C 7/06; G11C 7/1051
USPC ............................. 365/189.011, 206
See application file for complete search history.

(56) References Cited

U.S. PATENT DOCUMENTS

| 7,061,820 B2 | 6/2006 | Deng |
| 7,256,621 B2 | 8/2007 | Lih et al. |
| 7,804,330 B2 | 9/2010 | Bhat et al. |
| 8,048,732 B2 | 11/2011 | Kapoor et al. |
| 2004/0104744 A1* | 6/2004 | Bosshart ................. 326/95 |
| 2010/0008398 A1 | 1/2010 | Nojima |
| 2010/0246293 A1* | 9/2010 | Dudeck et al. ............ 365/194 |

\* cited by examiner

*Primary Examiner* — Huan Hoang
(74) *Attorney, Agent, or Firm* — Arent Fox LLP

(57) ABSTRACT

A memory circuit is provided comprising a plurality of bit cells coupled to a bit line that permits accessing information from each of the plurality of bit cells. A sense inverter is coupled to an output of the bit line. A keeper circuit has an output coupled to the bit line to compensate for current leakage from the plurality of bit cells. The keeper circuit may comprise an n-channel metal-oxide-silicon (NMOS) transistor in series with a p-channel metal-oxide-silicon (PMOS) transistor.

33 Claims, 8 Drawing Sheets

WEAK KEEPER CIRCUIT FOR MEMORY DEVICE

BACKGROUND

1. Field

A keeper circuit for memory devices is disclosed that compensates for voltage droop in bit lines due to transistor leakage of bit cells.

2. Background

Memory devices are often designed to include a plurality of bit-lines, with each bit-line being coupled to a plurality of bit cells. Selecting a bit cell may comprise turning on an access transistor for the selected bit cell to allow the memory element of the bit cell to pull charge from the bit-line to a circuit ground. Deselecting a bit cell involves turning off the access transistors to prevent the non-selected bit cells from pulling charge from the bit-line. Even after the access transistors for the non-selected bit cells are turned off, these bit-cell transistors still leak some charge and the sum of the entire off device leakage can be equivalent or greater than a single on device current, thus causing a false evaluation. Although the leakage current of a bit cell is small, the leakage becomes a larger issue as memory arrays grow in size. A memory array increases leakage currents proportionately with the number of bit cells coupled to the same bit-line in parallel. When leakage currents approach or exceed the charge pulled by a selected bit cell, the sense circuitry of the memory device may require more time to distinguish, or may be unable to distinguish, a voltage drop due to pulling by a selected bit cell from a voltage drop due to leakage current.

Consequently, a circuit is needed that addresses voltage droop on bit lines for memory devices.

SUMMARY

A first feature provides a memory circuit comprising: a plurality of bit cells, a sense inverter, and a keeper circuit. The plurality of bit cells may be coupled to a bit line that permits accessing information from each of the plurality of bit cells. The sense inverter may be coupled to an output of the bit line. The keeper circuit may have an output coupled to the bit line to compensate for current leakage from the plurality of bit cells, the keeper circuit comprising an n-channel metal-oxide-silicon (NMOS) transistor in series with a p-channel metal-oxide-silicon (PMOS) transistor. A gate of the PMOS transistor of the keeper circuit may be coupled to an output of the sense inverter and a drain of the PMOS transistor of the keeper circuit is coupled to the bit line. A source of the NMOS transistor may be coupled to a supply voltage Vdd, and a drain of the NMOS transistor is coupled to a source of the PMOS transistor. The NMOS transistor may be configured to enable the keeper circuit and the PMOS transistor is configured to provide a compensating current to the bit line based on the output of the sense inverter. The NMOS transistor may be configured to limit a source voltage (Vs) of the PMOS transistor to Vdd−Vtn, where Vdd is a supply voltage to the source of the NMOS transistor and Vtn is a threshold voltage for the NMOS transistor. The PMOS transistor may be configured to conduct a drain current that starts flowing into the bit line when the bit line voltage drops to Vdd−Vtn, where Vdd−Vtn is greater than a threshold voltage for the sense inverter. The NMOS transistor of the keeper circuit may be of the same type as NMOS transistors used by the plurality of bit cells. The NMOS transistor and PMOS transistor may have a lower threshold voltage in comparison to transistors of the sense inverter. The NMOS transistor and PMOS transistor may have a source-to-drain distance that is minimized to a minimum length feasible for a particular manufacturing process used in manufacturing the keeper circuit.

A second feature provides a keeper circuit for memory devices, comprising: (a) an n-channel metal-oxide-silicon (NMOS) transistor having a source coupled to a source voltage; and (b) a p-channel metal-oxide-silicon (PMOS) transistor having a source coupled to a drain of the NMOS transistor, a drain of the PMOS transistor for coupling to a bit line at an input of an inverter and a gate of the PMOS transistor for coupling to an output of the inverter. The NMOS transistor may serve to enable the keeper circuit and the PMOS transistor provides a compensating current to the bit line based on the output of the inverter. The NMOS transistor may limit a source voltage (Vs) of the PMOS transistor to Vdd−Vtn, where Vdd is a supply voltage to the source of the NMOS transistor and Vtn is a threshold voltage for the NMOS transistor. The PMOS transistor drain current starts flowing into the bit line when the bit line voltage drops to Vdd−Vtn, where Vdd−Vtn is greater than a threshold voltage for the sense inverter. The NMOS transistor and PMOS transistor may have a lower threshold voltage in comparison to transistors of the inverter. The NMOS transistor and PMOS transistor may have a source-to-drain distance that is minimized to a minimum length feasible for a particular manufacturing process used in manufacturing the keeper circuit.

BRIEF DESCRIPTION OF THE DRAWINGS

Various features and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

According to one aspect, a keeper circuit comprising an n-channel metal-oxide-silicon (NMOS) transistor in series with a p-channel metal-oxide-silicon (PMOS) transistor is used to compensate for voltage droop in the local read bit lines.

Exemplary Two Stack PMOS Keeper Circuit

Figure 1:
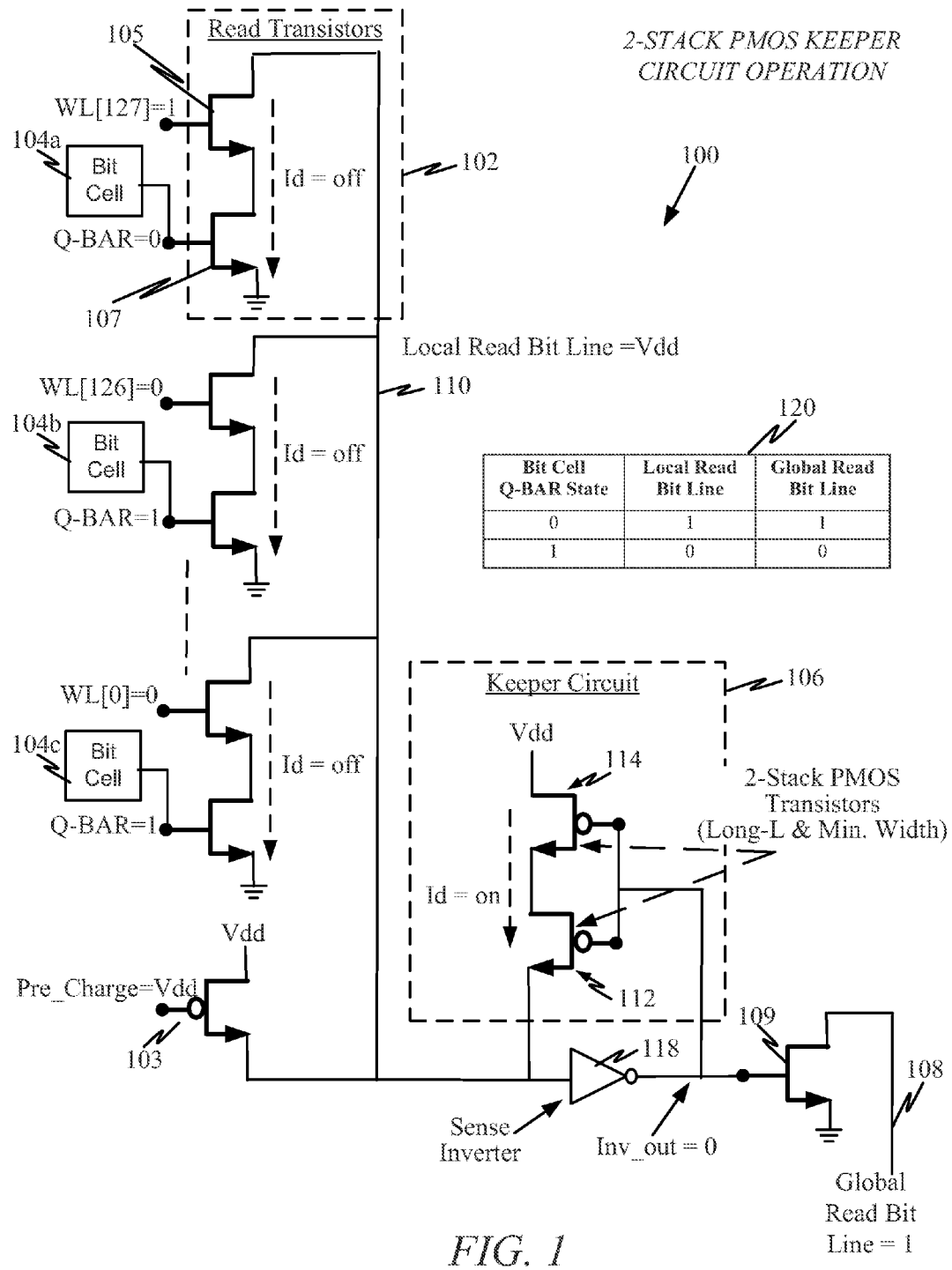
FIG. 1 illustrates a single ended full swing memory design including access transistors for bit cells of a memory device.

FIG. 1 illustrates a first single ended full swing memory design including access transistors 102 for bit cells 104a, 104b, and 104c of a memory device 100 and a two stack PMOS keeper circuit 106. Each bit cell 104a, 104b, and 104c may have corresponding read transistors 102 coupled to a local read bit line 110. The local read bit line 110 may be pre-charged to a voltage Vdd (e.g., also referred to as HIGH state or logical 1) by a pre-charge transistor 103 (e.g., a PMOS transistor) coupled to the local read bit line 110. The read transistors 102 may include a first transistor 105 (e.g., read-pass transistor) and a second transistor 107 (e.g., read-access transistor) in series, where the source of the first transistor 105 is coupled to the local read bit line 110, and the drain of the first transistor 105 is coupled to the source of the second transistor 107. The gate of the first transistor 105 (e.g., read-pass transistor) is held LOW (e.g., word line WL=0) when the corresponding bit cell 104a is not being read. When the bit cell 104a is to be read, the gate of corresponding first transistor 105 is held HIGH (e.g., word line WL=1). Then, if the memory bit cell 104a stores a logic state such that the gate of the second transistor 107 (e.g., read-access transistor) is LOW (e.g., Q-BAR=0) when the memory bit cell 104a is read, then the local read bit line 110 is maintained in the pre-charged HIGH state (e.g., logical 1, Vdd, or Read-1). Otherwise, if the memory bit cell 104a stores a logic state such that the gate of the second transistor 107 (e.g., read-access transistor) is HIGH (e.g., Q-BAR=1) when the memory bit cell 104a is read, then the local read bit line 110 is discharged to LOW (e.g., logical 0, or Read-0). Table 120 illustrates the typical states expected for a memory read operation at a bit cell Q-BAR, local read bit line 110, and global bit line 108.

One problem encountered with the memory device 100 is that while the local read bit line 110 is set to the pre-charged voltage Vdd (e.g., logical 1 or HIGH), current leakage from the bit cells 104a, 104b, and 104c may cause the bit line voltage to droop (e.g., voltage drop or decrease) to less than the pre-charged voltage Vdd. This bit line voltage droop, in extreme cases, can result in bits to be read incorrectly.

Figure 2:
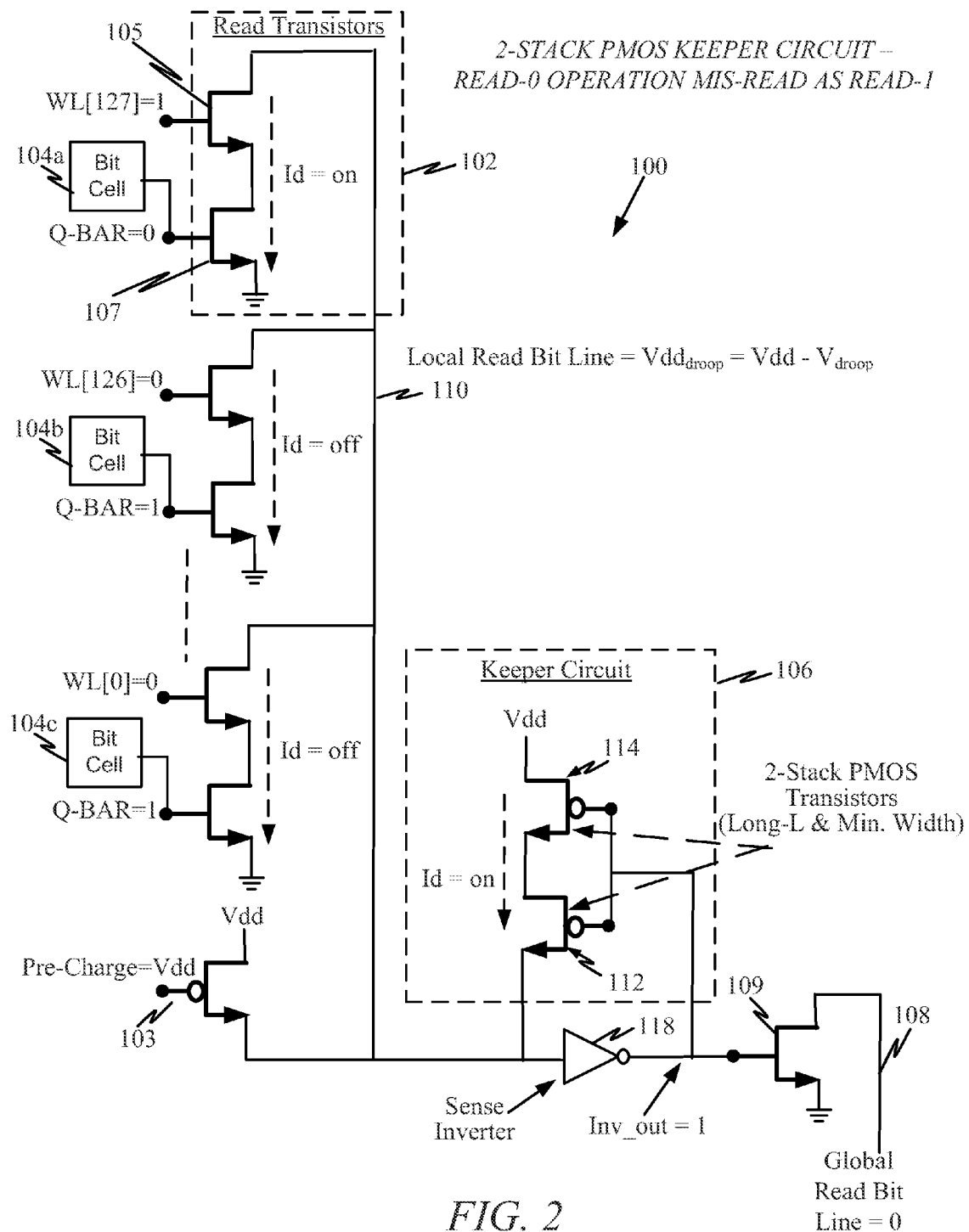
FIG. 2 illustrates the memory design of FIG. 1 in which current leakage from the bit cells has resulted in a voltage droop $V_{droop}$ on the local read bit line.

FIG. 2 illustrates the first single ended full swing memory design of FIG. 1 in which current leakage from the bit cells has resulted in a voltage droop $V_{droop}$ on the local read bit line 110 (where $Vdd_{droop}=Vdd-V_{droop}$, and $Vdd_{droop}<Vdd$). This bit line voltage droop $V_{droop}$, in extreme cases, can result in a logical 1 or HIGH state at the local read bit line 110 (e.g., Q-BAR=0) to be sensed as a LOW state (e.g. logical 0,) at the output of the global bit-line 108.

For instance, in FIG. 1 the global read bit line 108 has been pre-charged to HIGH (e.g., logical 1 or Vdd). The first bit cell 104a has an output Q-BAR=0, which results in the gate of an output transistor 109 to be LOW (or zero) thereby keeping the global read bit line 108 (which has been pre-charged) at a HIGH state (e.g., logical 1 or Vdd).

By contrast, in FIG. 2, bit cell leakage has caused the local read bit line 110 to drop to $Vdd_{droop}$, where $Vdd_{droop}<Vdd$. While the first bit cell 104a has an output Q-BAR=0, which should normally result in the global read bit line 108 to be HIGH (e.g., logical 1), the local read bit line voltage $Vdd_{droop}$ has dropped the local read bit line 110 voltage sufficiently that it is incorrectly sensed as logical 0 or LOW, thereby causing the global read bit line 108 to be logical 0 or LOW (instead of logical 1 or HIGH).

In one approach to address voltage droop in local read bit lines of memory devices, the number of bit cells 104a, 104b, 104c coupled to the local read bit line 110 may be limited in order to reduce the total leakage currents from the bit cells 104a, 104b, and 104c. However, this approach increases the die area needed to implement the same number of bit cells in comparison to having those bit cells coupled to the same local read bit line. That is, because the number of bit cells per local read bit line is limited in this approach, a greater number of local read bit lines must be used.

In another approach that addresses voltage droop in local read bit lines of memory devices, a keeper circuit 106 may be used comprising 2-stacked PMOS transistors 112 and 114 (Long Channel) to "hold" the bit line voltage to the typical pre-charged voltage level Vdd (e.g., logical 1 or HIGH). In this example, a first PMOS transistor 114 is coupled in series with a second PMOS transistor 112, with the source of the first PMOS transistor 114 coupled to a source voltage Vdd, the drain of the first PMOS transistor 114 coupled to the source of the second PMOS transistor 112, and the drain of the second PMOS transistor 112 coupled to the local read bit line 110. The gates of the first PMOS transistor 114 and second PMOS transistor 112 are coupled to the output of a sense inverter 118 which is coupled between the local read bit line 110 and the output transistor 109. However, this two-stacked PMOS keeper circuit 106 has the disadvantage of slowing down a read operation from a weak bit cell 104a (e.g., a 6-Sigma distribution from the mean) in that such read operation has to overcome the PMOS keeper circuit 106 during a Read-0 on the local read bit line 110 (e.g., when the output of a bit cell is Q-BAR=1). For instance, when the output from a bit cell 104a is Q-BAR=1, the read transistors 102 will try to pull the local read bit line 110 LOW, but the keeper circuit 106 will have its PMOS transistors 112 and 114 On and tries to pull the local read bit line 110 HIGH. If improperly margined, this can lead to defective bit cells which results in yield loss in the production of such memory devices. That is, if improperly margined, some read transistors 102 may not be able to overcome the keeper circuit 106, leading to what was supposed to be a Read-0 on the local read bit line 110 (e.g., Q-BAR=1) being incorrectly sensed as a Read-1 (e.g., Q-BAR=0).

Exemplary NMOS+PMOS Weak Keeper Circuit

Figure 3:
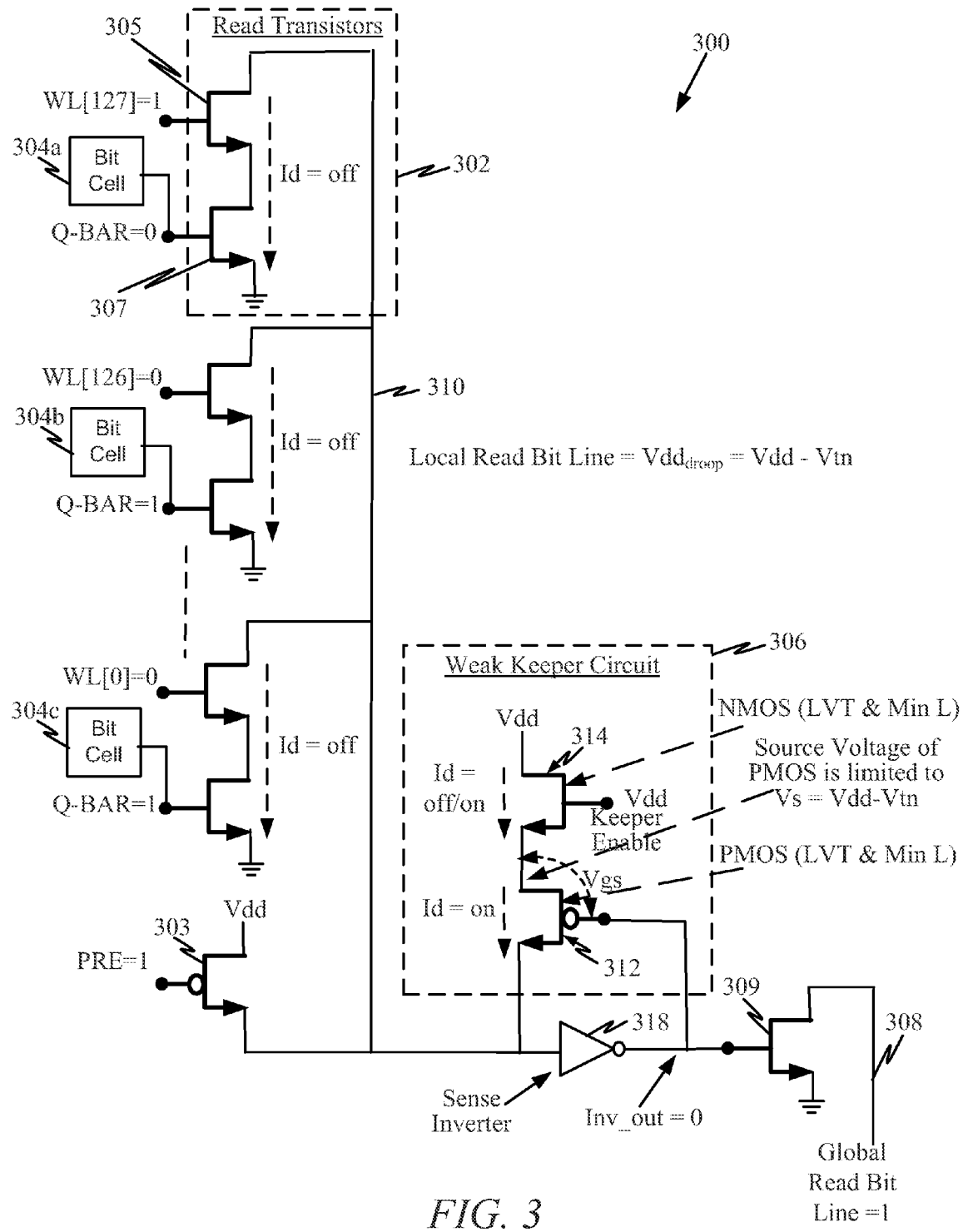
FIGS. 3 and 4 illustrate a NMOS+PMOS weak keeper circuit that compensates for a voltage droop caused by bit cell leakage on a local read bit line.

FIG. 3 illustrates a NMOS+PMOS weak keeper circuit that compensates for a voltage droop caused by bit cell leakage on a local read bit line. The NMOS+PMOS weak keeper circuit 306 may be part of a single ended full swing memory device 300 that includes a plurality of bit cells 304a, 304b, and 304c coupled to a local read bit line 310. Each bit cell 304a, 304b, and 304c may have corresponding read transistors 302 coupled to the local read bit line 310. The local read bit line 310 may be pre-charged to a voltage Vdd (e.g., HIGH state or logical 1) by a pre-charge transistor 303 (e.g., a PMOS transistor). The read transistors 302 may include a first transistor 305 (e.g., read-pass transistor) and a second transistor 307 (e.g., read-access transistor) in series, where the source of the first transistor 305 is coupled to the local read bit line 310, and the drain of the first transistor 305 is coupled to the source of the second transistor 307. The gate of the first transistor 305 (e.g., read-pass transistor) is held LOW (e.g., word line WL=0) when the corresponding bit cell 304a is not being read. When the bit cell 304a is to be read, the gate of corresponding first transistor 305 is held HIGH (e.g., word line WL=1). Then, if the memory bit cell 304a stores a logic state such that the gate of the second transistor 307 (e.g., read-access transistor) is LOW (e.g., Q-BAR=0) when the memory bit cell 304a is read, then the local read bit line 310 is maintained at the pre-charged HIGH state (e.g., logical 1 or Vdd). Otherwise, if the memory bit cell 304a stores a logic state such that the gate of the second transistor 307 (e.g., read-access transistor) is HIGH (e.g., Q-BAR=1) when the memory bit cell 304a is read, then the local read bit line 310 is discharged to LOW (e.g., logical 0).

While the local read bit line 310 is set to the pre-charged voltage Vdd (e.g., logical 1 or HIGH), current leakage from the bit cells 304a, 304b, and 304c can cause the bit-line voltage to droop to less than the pre-charged voltage Vdd.

The weak keeper circuit 306 may be coupled to the local read bit line 310 prior to an inverter 318 which output is coupled to a gate of an output transistor 309. The source of the output transistor 309 is coupled to a global read bit line 308 that is pre-charged to HIGH (e.g., logical 1 or Vdd).

The weak keeper circuit 306 may comprise an NMOS transistor 314 in series with a PMOS transistor 312, where the source of the NMOS transistor 314 is coupled to a source voltage Vdd, the drain of the NMOS transistor 314 is coupled to the source of the PMOS transistor 312 and the drain of the PMOS transistor 312 is coupled to the local read bit line 310 prior to the sense inverter 318. The gate of the PMOS transistor 312 is coupled to the output of the sense inverter 318, which causes the PMOS transistor 312 to be turned On (at least partially) when the voltage on the local read bit line 310 drops to or below Vdd−Vtn (where Vtn is the threshold voltage for the NMOS transistor 314).

Stacking of the PMOS transistor 312 with the NMOS transistor 314 limits the source voltage of the PMOS transistor 312 to Vdd−Vtn (where Vtn is the threshold voltage for the NMOS transistor 314). During a Read-1 operation on the local read bit line 310 (e.g., where a bit cell outputs Q-BAR=0 or LOW), the local read bit line 310 voltage can droop down to a voltage $Vdd_{droop}$=Vdd−Vtn before the PMOS transistor 312 current Id starts to flow. That is, upon the local read bit line 310 voltage drooping from Vdd to Vdd−Vtn, the PMOS transistor 312 is switched On so that current Id flows from its source to the drain when the gate of the NMOS transistor is enabled. The local read bit line 310 is thus held at Vdd−Vtn by the weak keeper circuit 306 instead of at Vdd, which is the case with the two-stack PMOS keeper circuit 106 of FIGS. 1 and 2.

If the sense inverter 318 is constructed from higher threshold voltage Vt devices compared to the threshold voltage Vtx for the PMOS/NMOS transistors 312/314 in the weak keeper circuit 306, the sense inverter 318 output inv_out will not be triggered/changed during a Read-1 operation (e.g., bit cell having Q-BAR=0). The PMOS transistor 312 in the weak keeper circuit 306 sees a reduced gate-source voltage Vgs due to the NMOS transistor 314 limiting the source voltage (Vs) of the PMOS transistor 312 to Vdd−Vtn. This reduced gate-source voltage Vgs of the PMOS transistor 312 limits the speed degradation of the sense inverter 318 during a Read-0 operation on the local read bit line 310 (illustrated in FIG. 3) while at the same time providing a leakage compensation margin during a Read-1 operation (illustrated in FIG. 4).

Initially, the NMOS transistor 314 has a current Id=Off as its gate is at Vdd and its drain is at Vdd−Vtn (i.e., the NMOS transistor 314 is turned off). However, if the drain voltage decreases or is pulled lower, the current Id=On to support the current leakage (e.g., to compensate for current leakage from the plurality of bit cells).

Figure 4:
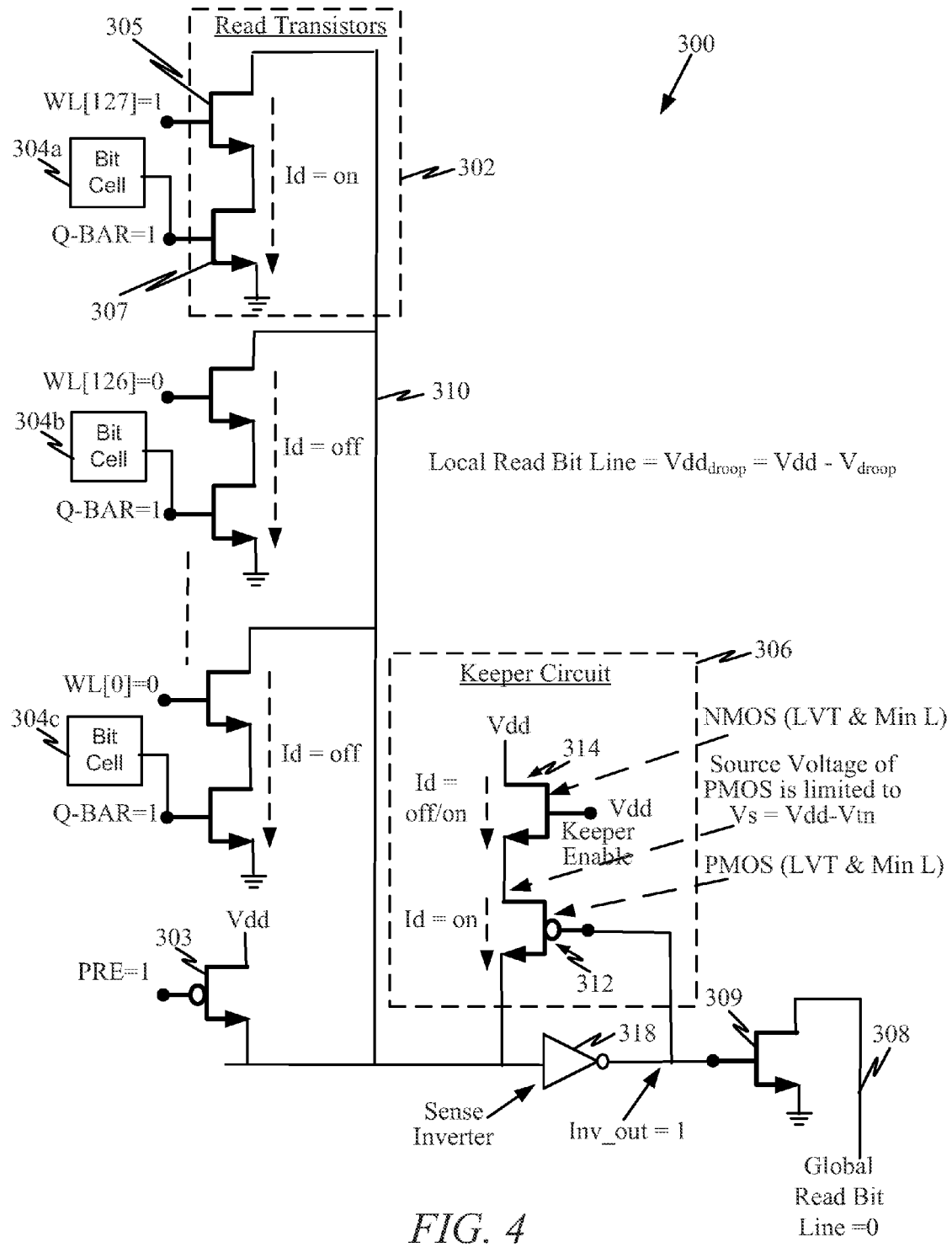
Figure 5:
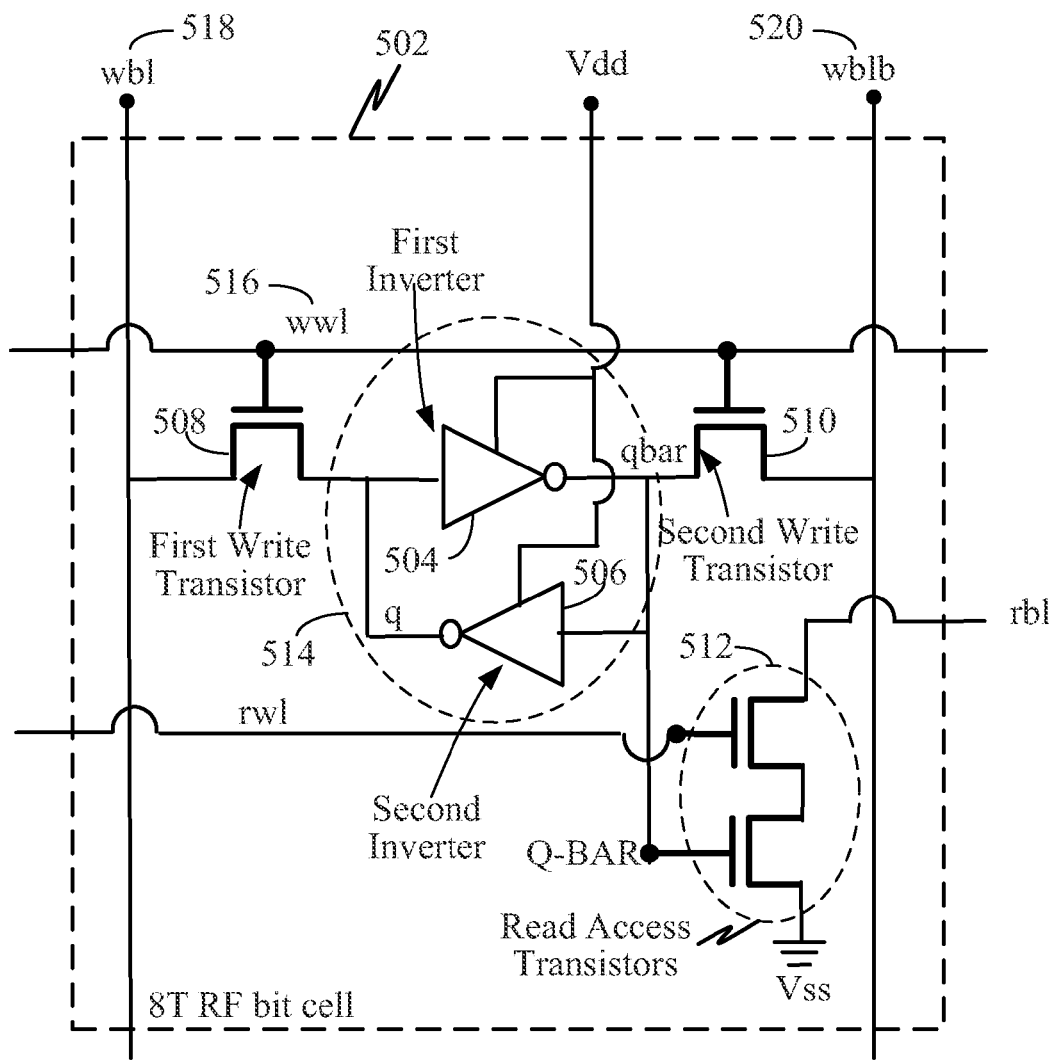
FIG. 5 illustrates one example of a memory bit cell that may be coupled to read transistors.
Figure 6:
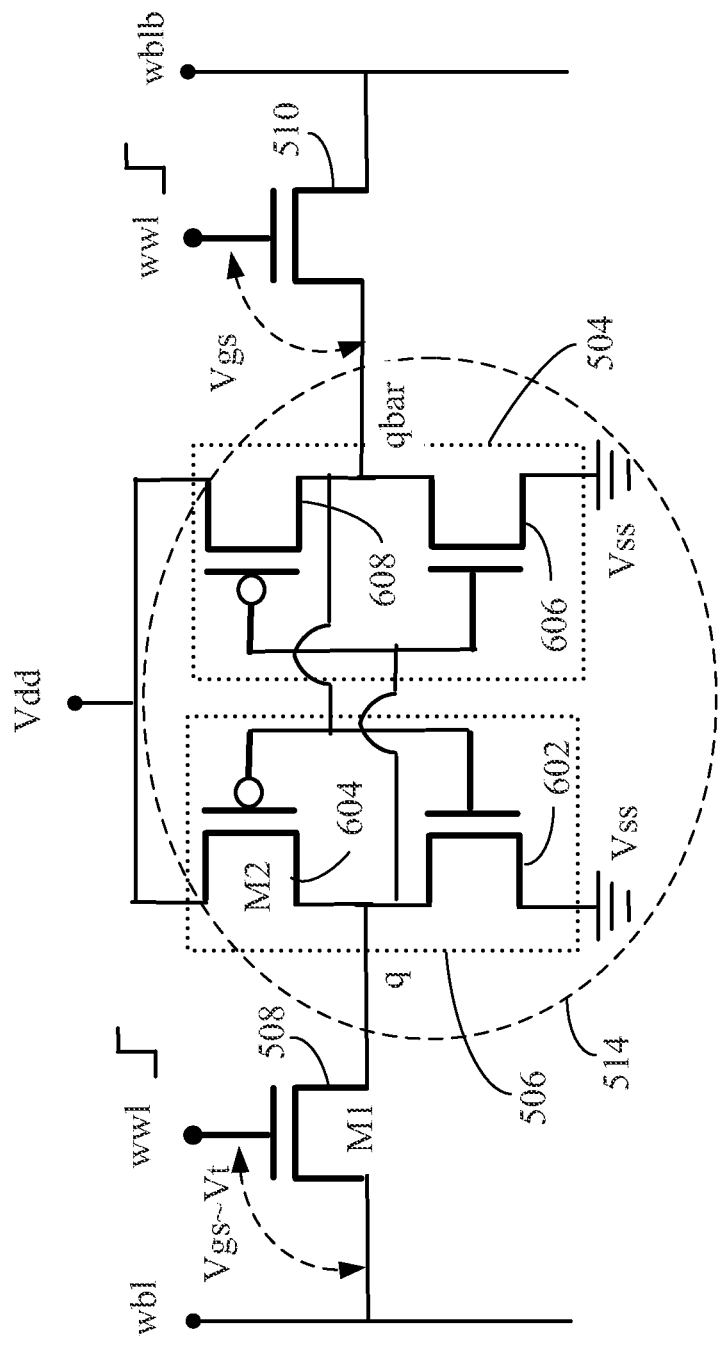
FIG. 6 illustrates a detailed implementation of part of the memory cell of FIG. 5.

FIG. 5 illustrates one example of a memory bit cell that may be coupled to read transistors. The memory cell 502 may comprise a cell core 514 (first inverter 504, and second inverter 506), a first write transistor 508, a second write transistor 510, and a pair of read access transistors 512. FIG. 6 illustrates a detailed implementation of part of the memory cell 502 of FIG. 5. In various examples, the memory cell 502 maybe the bit cells 104 (FIGS. 1 and 2) and/or 304 (FIGS. 3 and 4) and the read access transistors 512 may be the read transistors 102 (FIGS. 1 and 2) and/or 302 (FIGS. 3 and 4). While the exemplary memory bit cell illustrated in FIGS. 5 and 6 are an 8-transistor register file bit cell, other types of bit cells (e.g., 6-transistor register file bit cells) may be employed with the weak keeper circuit 306.

The cell core 514 may include a first inverter 504, including a first driver transistor 606 (FIG. 6, pull-down transistor) and a first load transistor 608 (pull-up transistor), and a second inverter 506, including a second driver transistor 602 (pull-down transistor) and a second load transistor 604 (pull-up transistor). In this example, the load transistors 604 and 608 (pull-up transistors) are PMOS transistors and the driver transistors 602 and 606 (pull-down transistors) are NMOS transistors. The first inverter 504 has a first output qbar formed by a connection between the drain of the first load transistor 608 and the drain of the first driver transistor 606, and a first input q formed by a connection between the gate of the first driver transistor 606 and the gate of the first load transistor 608. Similarly, the second inverter 506 has a second output q formed by a connection between the drain of the second load transistor 604 and the drain of the second driver transistor 602, and a second input (or the first output) qbar (also referred to a Q-BAR) formed by a connection between the gate of the second load transistor 604 and the gate of the second driver transistor 602. In a conventional manner, the first and second inverters 504, 506 are cross-coupled, meaning that the output of each inverter is connected to the input of the other, to form the cell core 514 that stores a single bit of information.

The first write transistor 508 is connected to the second output (first input) q. Similarly, the complimentary second write transistor 510 is connected to the first output (second input) qbar (also referred to a Q-BAR). The gates of the second write transistor 510 and first write transistor 508 are each connected to a write wordline (WWL) 516. Together, the second write transistor 510 and the first write transistor 508 form a write circuit that is used to impose a state on the memory cell 502 in cooperation with the WWL 516, a write bit-line (WBL) 518 and a complementary write bit-line (WBLB) 520. For example, if the WBL 518 is set to a value of Vdd (logical 1 or high) while the WBLB 520 is set to value of Vss (logical 0 or low), then, when the WWL 516 is asserted (set to Vdd, HIGH, or logical 1), the output q of the second inverter 506 will be set to a value of Vdd−Vtn, where Vtn is the threshold voltage of the first write transistor 508, while the output qbar of the first inverter 504 will be set to Vss.

Based on the examples in FIGS. 3-6, a memory circuit has been disclosed with a novel weak keeper circuit 306 that compensates for voltage droop in a local read bit line 310 due to bit cell current leakage. The memory circuit 300 may include a plurality of bit cells 304 coupled to a local read bit line 310 that permits accessing information from each of the plurality of bit cells 304. A sense inverter 308 is coupled to an output of the local read bit line 310 to provide either a logical "0" (LOW) or "1" (HIGH) output based on the voltage level perceived on the local read bit line 310. The keeper circuit 306 has an output coupled to the local read bit line 310 to compensate for current leakage from the plurality of bit cells, the keeper circuit 306 comprising a NMOS transistor 314 in series with a PMOS transistor 312. The NMOS transistor 314 serves to enable the keeper circuit 316 and the PMOS transistor 312 provides a compensating current (Id) to the local read bit line 310. The NMOS transistor 314 limits a source voltage (Vs) of the PMOS transistor 312 to Vdd−Vtn, where Vdd is a supply voltage to the source of the NMOS transistor 314 and Vtn is a threshold voltage for the NMOS transistor

314. The PMOS transistor 312 drain current (Id) into the local read bit line 310 starts flowing when the bit line voltage drops to Vdd−Vtn.

According to one aspect, the NMOS transistor 314 and/or PMOS transistor 312 may have a lower threshold voltage, Vtn and Vtp respectively, relative to transistors of the sense inverter 318. The lower threshold voltage for the transistors 312, 314 of the keeper circuit 306 allows the keeper circuit 306 to compensate for voltage droop on the local read bit line 310 more quickly than the sense inverter 318 is activated (e.g., switches from LOW to HIGH, or HIGH to LOW), thereby preventing the sense inverter 318 from erroneously triggering when the local read bit line 310 droops slightly.

Figure 7:
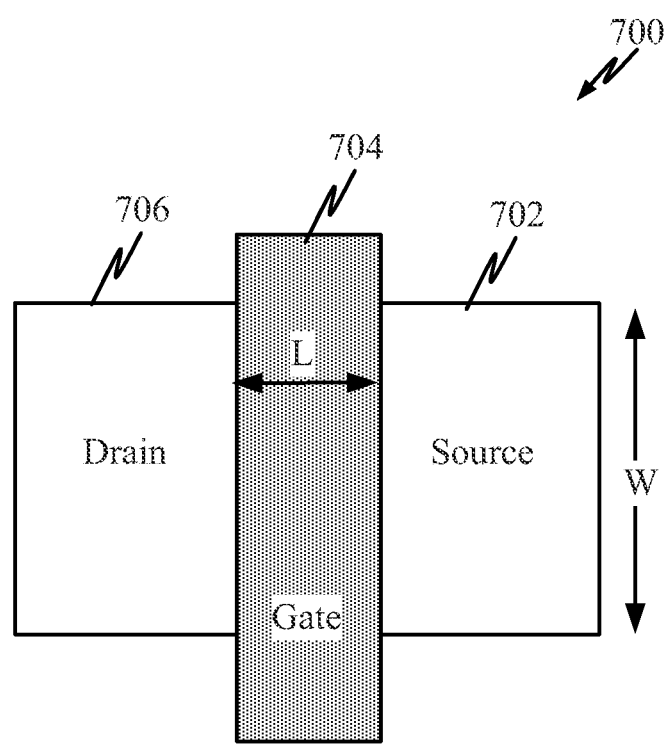
FIG. 7 illustrates a MOS device having a source and a drain of a width (W) and a gate of a length (L).

In one example, the NMOS transistor 314 may be of the same type as NMOS transistors used by the plurality of bit cells 304. For instance, the NMOS transistor 314 may have the same (a) source-to-drain distance, (b) a source and/or drain width, and/or (c) threshold voltages, etc., as the NMOS transistors in the bit cell 304 (e.g., bit cell 514 in FIGS. 5 and 6). In yet another example, the NMOS transistor 314 and PMOS transistor 312 have a source-to-drain transistor length that is minimized to a minimum feasible distance available under a particular manufacturing process or technology. FIG. 7 illustrates a MOS device 700 having a source 702 and a drain 706 of a width (W) and a gate 704 of a length (L). As illustrated here, the source-to-drain distance is referred to as the length (L) of the gate 704. For example, if 20 nanometer (nm) manufacturing technology is used, then the gate 704 would have a length (L) of 20 nm. This is in contrast to typical channel lengths that are two to three times the minimum length feasible for a particular manufacturing process or technology. The shorter gate length (L) increases the current leakage of the PMOS transistor 312, thereby helping to compensate for voltage droop on the local read bit line 310. Additionally, the width (W) of the PMOS transistor 312 may be sized so that it provides a relatively "weak" compensating current into the local read bit line 310, allowing the read transistors 302 to overcome this compensating current from the keeper circuit 306 when the read bit line 310 is being pulled LOW by the read transistors 302. Having the minimum channel length for the PMOS & NMOS keeper circuit minimizes area as compared to having the longer channel length device PMOS which are traditionally used for keeper circuits.

In various implementations, the weak keeper circuit 306 (FIG. 3) may be employed with register file memory devices. In one example, the weak keeper circuit 306 may operate on memory devices operating at 800 MHz to 1 GHz range. In another example, the weak keeper circuit 306 may be part of integrated memory that is part a processor, processing circuit, and/or system on a chip.

Figure 8:
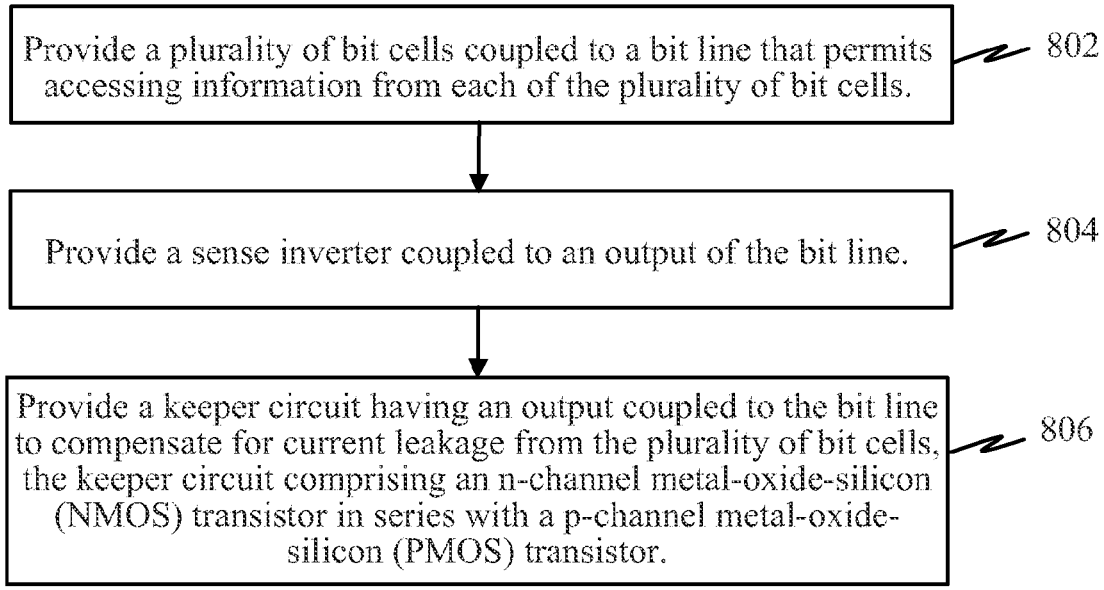
FIG. 8 illustrates a method for compensating for voltage droop in a memory bit line.

FIG. 8 illustrates a method for compensating for voltage droop in a memory bit line. A plurality of bit cells coupled to a bit line are provided that permits accessing information from each of the plurality of bit cells 802. A sense inverter coupled to an output of the bit line is also provided 804. A keeper circuit is provided having an output coupled to the bit line to compensate for current leakage from the plurality of bit cells, the keeper circuit comprising an n-channel metal-oxide-silicon (NMOS) transistor in series with a p-channel metal-oxide-silicon (PMOS) transistor 806.

One or more of the components, steps, features and/or functions illustrated in the FIGS. may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGS. may be configured to perform one or more of the methods, features, or steps described in the FIGS. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A memory circuit, comprising:
   a plurality of bit cells coupled to a bit line that permits accessing information from each of the plurality of bit cells;
   a sense inverter coupled to an output of the bit line; and
   a keeper circuit having an output coupled to the bit line to compensate for current leakage from the plurality of bit cells, the keeper circuit comprising an n-channel metal-oxide-silicon (NMOS) transistor in series with a p-channel metal-oxide-silicon (PMOS) transistor,
   wherein the NMOS transistor is configured to limit a source voltage (Vs) of the PMOS transistor.

2. The memory circuit of claim 1, wherein a gate of the PMOS transistor of the keeper circuit is coupled to an output of the sense inverter and a drain of the PMOS transistor of the keeper circuit is coupled to the bit line.

3. The memory circuit of claim 2, wherein a source of the NMOS transistor is coupled to a supply voltage Vdd, and a drain of the NMOS transistor is coupled to a source of the PMOS transistor.

4. The memory circuit of claim 1, wherein the NMOS transistor is configured to enable the keeper circuit and the PMOS transistor is configured to provide a compensating current to the bit line based on the output of the sense inverter.

5. The memory circuit of claim 4, wherein the NMOS transistor is configured to limit the source voltage (Vs) of the PMOS transistor to Vdd−Vtn, where Vdd is a supply voltage to the source of the NMOS transistor and Vtn is a threshold voltage for the NMOS transistor.

6. The memory circuit of claim 5, wherein the PMOS transistor is configured to conduct a drain current that starts flowing into the bit line when the bit line voltage drops to Vdd−Vtn, where Vdd−Vtn is greater than a threshold voltage for the sense inverter.

7. The memory circuit of claim 1, wherein the NMOS transistor of the keeper circuit is of the same type as NMOS transistors used by the plurality of bit cells.

8. The memory circuit of claim 1, wherein the NMOS transistor and PMOS transistor have a lower threshold voltage in comparison to transistors of the sense inverter.

9. The memory circuit of claim 1, wherein the NMOS transistor and PMOS transistor have a source-to-drain distance that is minimized to a minimum length feasible for a particular manufacturing process used in manufacturing the keeper circuit.

10. The memory circuit of claim 1, wherein the NMOS transistor is configured to limit the source voltage of the PMOS transistor to a voltage less than a voltage of a voltage supply connected to the NMOS transistor.

11. A method for compensating for voltage droop in a memory bit line, comprising:
    providing a plurality of bit cells coupled to a bit line that permits accessing information from each of the plurality of bit cells;
    providing a sense inverter coupled to an output of the bit line; and
    providing a keeper circuit having an output coupled to the bit line to compensate for current leakage from the plurality of bit cells, the keeper circuit comprising an n-channel metal-oxide-silicon (NMOS) transistor in series with a p-channel metal-oxide-silicon (PMOS) transistor,
    wherein the NMOS transistor limits a source voltage (Vs) of the PMOS transistor.

12. The method of claim 11, wherein a gate of the PMOS transistor of the keeper circuit is coupled to an output of the sense inverter and a drain of the PMOS transistor of the keeper circuit is coupled to the bit line.

13. The method of claim 12, wherein a source of the NMOS transistor is coupled to a supply voltage Vdd, and a drain of the NMOS transistor is coupled to a source of the PMOS transistor.

14. The method of claim 11, wherein the NMOS transistor serves to enable the keeper circuit and the PMOS transistor provides a compensating current to the bit line based on the output of the sense inverter.

15. The method of claim 14, wherein the NMOS transistor limits the source voltage (Vs) of the PMOS transistor to Vdd−Vtn, where Vdd is a supply voltage to the source of the NMOS transistor and Vtn is a threshold voltage for the NMOS transistor.

16. The method of claim 15, wherein the PMOS transistor drain current starts flowing into the bit line when the bit line voltage drops to Vdd−Vtn, where Vdd−Vtn is greater than a threshold voltage for the sense inverter.

17. The method of claim 11, wherein the NMOS transistor of the keeper circuit is of the same type as NMOS transistors used by the plurality of bit cells.

18. The method of claim 11, wherein the NMOS transistor and PMOS transistor have a lower threshold voltage in comparison to transistors of the sense inverter.

19. The method of claim 11, wherein the NMOS transistor and PMOS transistor have a source-to-drain distance that is minimized to a minimum length feasible for a particular manufacturing process used in manufacturing the keeper circuit.

20. A memory device, comprising:
    bit line means for accessing information from each of a plurality of bit cells;
    inverting means for inverting coupled to an output of the bit line; and
    compensating means for compensating for current leakage from the plurality of bit cells, the compensating means including an n-channel metal-oxide-silicon (NMOS) transistor in series with a p-channel metal-oxide-silicon (PMOS) transistor,
    wherein the NMOS transistor limits a source voltage (Vs) of the PMOS transistor.

21. The memory device of claim 20, wherein a gate of the PMOS transistor of the compensating means is coupled to an output of the means for inverting and a drain of the PMOS transistor of the compensating means is coupled to the bit line means.

22. The memory device of claim 21, wherein a source of the NMOS transistor is coupled to a supply voltage Vdd, and a drain of the NMOS transistor is coupled to a source of the PMOS transistor.

23. The memory device of claim 20, wherein the NMOS transistor serves to enable the compensating means and the PMOS transistor provides a compensating current to the bit line means based on the output of the inverting means.

24. The memory device of claim 23, wherein the NMOS transistor limits the source voltage (Vs) of the PMOS transistor to Vdd−Vtn, where Vdd is a supply voltage to the source of the NMOS transistor and Vtn is a threshold voltage for the NMOS transistor.

25. The memory device of claim 24, wherein the PMOS transistor drain current starts flowing into the bit line means when the bit line voltage drops to Vdd−Vtn, where Vdd−Vtn is greater than a threshold voltage for the inverting means.

26. The memory device of claim 20, wherein the NMOS transistor of the compensating means is of the same type as NMOS transistors used by the plurality of bit cells.

27. The memory device of claim 20, wherein the NMOS transistor and PMOS transistor have a lower threshold voltage in comparison to transistors of the inverting means.

28. A keeper circuit for memory devices, comprising:
an n-channel metal-oxide-silicon (NMOS) transistor having a source coupled to a source voltage; and
a p-channel metal-oxide-silicon (PMOS) transistor having a source coupled to a drain of the NMOS transistor, a drain of the PMOS transistor for coupling to a bit line at an input of an inverter and a gate of the PMOS transistor for coupling to an output of the inverter,
wherein the NMOS transistor limits a source voltage (Vs) of the PMOS transistor.

29. The keeper circuit of claim 28, wherein the NMOS transistor serves to enable the keeper circuit and the PMOS transistor provides a compensating current to the bit line based on the output of the inverter.

30. The keeper circuit of claim 29, wherein the NMOS transistor limits the source voltage (Vs) of the PMOS transistor to Vdd−Vtn, where Vdd is a supply voltage to the source of the NMOS transistor and Vtn is a threshold voltage for the NMOS transistor.

31. The keeper circuit of claim 28, wherein the PMOS transistor drain current starts flowing into the bit line when the bit line voltage drops to Vdd−Vtn, where Vdd−Vtn is greater than a threshold voltage for the sense inverter.

32. The keeper circuit of claim 28, wherein the NMOS transistor and PMOS transistor have a lower threshold voltage in comparison to transistors of the inverter.

33. The keeper circuit of claim 28, wherein the NMOS transistor and PMOS transistor have a source-to-drain distance that is minimized to a minimum length feasible for a particular manufacturing process used in manufacturing the keeper circuit.

* * * * *